United States Patent
Gao et al.

(10) Patent No.: US 11,415,372 B2
(45) Date of Patent: Aug. 16, 2022

(54) LOOP HEAT PIPE APPARATUS AND APPLICATION

(71) Applicant: Beijing Institute of Space Mechanics & Electricity, Beijing (CN)

(72) Inventors: Teng Gao, Beijing (CN); Tao Yang, Beijing (CN); Shilei Zhao, Beijing (CN); Zhenming Zhao, Beijing (CN); Chunlin Li, Beijing (CN); Shikui Luo, Beijing (CN); Pan Lu, Beijing (CN); Yinxue Yan, Beijing (CN); Feng Yu, Beijing (CN); Qingliang Meng, Beijing (CN)

(73) Assignee: Beijing Institute of Space Mechanics & Electricity, Beijing (CN)

( * ) Notice: Subject to any disclaimer, the term of this patent is extended or adjusted under 35 U.S.C. 154(b) by 242 days.

(21) Appl. No.: 16/627,601

(22) PCT Filed: Sep. 27, 2018

(86) PCT No.: PCT/CN2018/107785
§ 371 (c)(1),
(2) Date: Dec. 30, 2019

(87) PCT Pub. No.: WO2019/114368
PCT Pub. Date: Jun. 20, 2019

(65) Prior Publication Data
US 2020/0124355 A1    Apr. 23, 2020

(30) Foreign Application Priority Data

Dec. 11, 2017  (CN) .......................... 201711311537.X

(51) Int. Cl.
*F28D 15/04*    (2006.01)
*F28D 15/06*    (2006.01)
*F28D 15/02*    (2006.01)

(52) U.S. Cl.
CPC ........... *F28D 15/043* (2013.01); *F28D 15/06* (2013.01); *F28D 15/0266* (2013.01)

(58) Field of Classification Search
CPC .... F28D 15/06; F28D 15/0266; F28D 15/043; H01L 23/427
See application file for complete search history.

(56) References Cited

U.S. PATENT DOCUMENTS 6,058,711 A    5/2000  Maciaszek et al.
7,004,240 B1   2/2006  Kroliczek et al.
(Continued)

FOREIGN PATENT DOCUMENTS

CN    101026946 A    8/2007
CN    103482086 A    1/2014
(Continued)

OTHER PUBLICATIONS

Butler et al, Loop Heat Pipes and Capillary Pumped Loops: An Applications Perspective, Jan. 2001, NASA, pp. 3-4 (Year: 2001).*
European Search Report, Application No. 18889400.0, dated Dec. 9, 2020.
First Office Action, Chinese Application No. 201711311537, dated Mar. 21, 2019.
(Continued)

*Primary Examiner* — Eric S Ruppert
*Assistant Examiner* — Christopher C Pillow
(74) *Attorney, Agent, or Firm* — Honigman LLP; Matthew H. Szalach; Jonathan P. O'Brien

(57) ABSTRACT

An energy-saving loop heat pipe apparatus and an application are provided. The loop heat pipe apparatus comprises a capillary pump component and an evaporation unit component. The loop heat pipe apparatus further comprises at least one heat exchanger disposed between the capillary pump component and the evaporation unit component for heating, by using heat of a circulating working medium in the loop heat pipe, the circulating working medium about to enter the evaporation unit component.

19 Claims, 2 Drawing Sheets

(56) References Cited

U.S. PATENT DOCUMENTS

| | | |
|---|---|---|
| 9,273,887 B2 | 3/2016 | Kroliczek et al. |
| 2003/0085024 A1* | 5/2003 | Santiago ............ B01D 19/0031 |
| | | 257/E23.098 |
| 2012/0175087 A1 | 7/2012 | Kroliczek et al. |
| 2013/0186602 A1 | 7/2013 | Figus |
| 2013/0306278 A1* | 11/2013 | Hoang ................. F28D 15/043 |
| | | 165/104.26 |
| 2015/0138830 A1* | 5/2015 | Yu ......................... G02F 1/1336 |
| | | 362/609 |
| 2015/0020746 A1 | 7/2015 | Rust, III et al. |
| 2015/0207465 A1 | 7/2015 | Rust, III et al. |
| 2016/0047605 A1* | 2/2016 | Mishkinis ............... F28D 15/06 |
| | | 165/104.25 |
| 2018/0002390 A1 | 1/2018 | Dupont |
| 2018/0023900 A1 | 1/2018 | Dupont |

FOREIGN PATENT DOCUMENTS

| | | |
|---|---|---|
| CN | 103562666 A | 2/2014 |
| CN | 104066304 A | 9/2014 |
| CN | 104930893 A | 9/2015 |
| CN | 105910479 A | 8/2016 |
| CN | 107208980 A | 9/2017 |
| CN | 108089618 A | 5/2018 |
| JP | 2005147625 A | 6/2005 |

OTHER PUBLICATIONS

State Intellectual Property Office (P.R.C.) as International Searching Authority, International Search Report for PCT Application No. PCT/CN2018/107785, dated Jan. 2, 2019.

* cited by examiner

LOOP HEAT PIPE APPARATUS AND APPLICATION

The present application is the National phase of International Application No. PCT/CN2018/107785, titled "ENERGY-SAVING LOOP HEAT PIPE APPARATUS AND APPLICATION", filed on Sep. 27, 2018, which claims priority to Chinese Patent Application No. 201711311537.X, titled "ENERGY-SAVING TEMPERATURE-CONTROLLED LOOP HEAT PIPE APPARATUS FOR AEROSPACE OPTICAL REMOTE SENSOR", filed on Dec. 11, 2017 with the National Intellectual Property Administration, PRC, the entire disclosures of which are incorporated herein by reference in their entireties.

FIELD

The present application relates to an energy-saving loop heat pipe apparatus and an application thereof, and belongs to the technical field of thermal control.

BACKGROUND

A temperature-controlled loop heat pipe is an important technology in the field of thermal control of remote sensor, which is mainly used for temperature control of high power imaging circuits (CCD devices, CMOS devices and the like). The temperature-controlled loop heat pipe has the advantages of strong heat transfer ability, stable temperature control performance, no vibration source, mechanical decoupling and so on, and is widely used in the field of thermal control of remote sensor in China.

At present, a power-constant loading mode is adopted for heating loops of the evaporator and preheater of a temperature-controlled loop heat pipe for remote sensing satellites operating in orbit, that is, regardless of whether a remote sensing camera is in an intermittent power-on period (8 minutes) or a long standby period (90 minutes), the heating loops installed at the two positions are closed-loop heated for a long time, and the heat loaded on the loop heat pipe remains unchanged. A vapor phase working medium flowing out of the evaporator of the loop heat pipe is condensed into a liquid phase after being cooled by a radiator, and then transforms into a vapor-liquid two-phase state after being heated by the preheater. Because no heat exchanger is installed between the evaporator and preheater of a conventional loop heat pipe, the working medium flowing into the preheater is not preheated by the vapor phase working medium flowing out of the evaporator, resulting in a certain degree of heat loss of the working medium in the loop heat pipe and a non-maximum use efficiency of the thermal control power.

Because the temperature control power loaded by the evaporator and preheater of the loop heat pipe is finally dissipated into the aerospace through the radiator, a larger temperature control power needs a larger radiator area, and the radiator inevitably becomes heavier, which is contrary to the goal for designing lightweight remote sensors. The conventional loop heat pipe can hardly meet the specification requirements of cameras.

Therefore, the conventional temperature-controlled loop heat pipe has a problem of excessive resource consumption, so it is urgent to carry out targeted optimization design for the conventional temperature-controlled loop heat pipe. Moreover, with the increase of the heating power of CCD devices of the remote sensors, the increase of the number thereof, and the improvement of the temperature index thereof, resources such as the thermal control power and the radiator's weight which are required by the conventional temperature-controlled loop heat pipe are increased, these resources far exceed the bearing capacity of the remote sensing cameras, which become a bottleneck factor restricting the development of remote sensing camera technology.

In order to reduce the thermal control resources consumed by the temperature-controlled loop heat pipe under the premise of satisfying the temperature index of the CCD devices of the remote sensing cameras, it is necessary to carry out a targeted energy-saving design for the loop heat pipe.

SUMMARY

An energy-saving loop heat pipe apparatus and an application thereof are provided according to the present application to overcome disadvantages of the conventional technology. By providing a heat exchanger between an evaporation unit assembly and an capillary pump assembly, the liquid working medium that is about to enter the evaporation unit assembly is heated by the heat of the vapor phase working medium flowing out of the evaporation unit assembly, thereby maximizing the utilization of the waste heat and saving energy.

In order to solve the above technical problem, the following technical solutions are provided according to the present application.

An energy-saving loop heat pipe apparatus includes a capillary pump assembly and an evaporation unit assembly, and further includes at least one heat exchanger arranged between the capillary pump assembly and the evaporation unit assembly for heating a circulating working medium that is about to enter the evaporation unit assembly by using the heat of the circulating working medium itself in a loop heat pipe.

In an optional embodiment, the evaporation unit assembly includes a preheater and at least one evaporation unit, the preheater is used for heating the circulating working medium passing by to a vapor-liquid two-phase state, and the at least one evaporation unit is used for cooling a heat source. The circulating working medium flows through the preheater after flowing through the heat exchanger, and then enters the at least one evaporation unit.

In an optional embodiment, the preheater includes a preheater body and a preheating heating circuit. The preheating heating circuit is arranged outside the preheater body, and is used for determining a heating power according to a temperature of the circulating working medium entering the preheater body and heating the circulating working medium passing by to the vapor-liquid two-phase state.

In an optional embodiment, the preheating heating circuit includes a controller, and a temperature measuring element, and further includes a first stage heating circuit, a second stage heating circuit and a third stage heating circuit which have different powers. The temperature measuring element is used for measuring a temperature of the circulating working medium entering the preheater body, and the controller is used for determining the heating power according to the temperature measured by the temperature measuring element and controlling the heating of the first stage heating circuit, the second stage heating circuit and/or the third stage heating circuit according to the determined heating power.

In an optional embodiment, the heating power of the first stage heating circuit is 3 W to 7 W.

In an optional embodiment, the heating power of the second stage heating circuit is 8 W to 12 W.

In an optional embodiment, the heating power of the third stage heating circuit is 13 W to 17 W.

In an optional embodiment, the preheating heating circuit includes a heating unit, a controller, a flowmeter and two temperature measuring elements, the flowmeter is arranged on a pipeline ahead of the preheater for measuring a flow rate of the circulating working medium in the loop heat pipe, the two temperature measuring elements are respectively used for measuring a temperature of the circulating working medium in a liquid reservoir of the capillary pump assembly and a temperature of the circulating working medium entering the preheater, and the controller is used for determining a heating power of the heating unit according to the flow rate measured by the flowmeter and the temperatures measured by the temperature measuring elements, so that the heating unit heats the circulating working medium passing by to the vapor-liquid two-phase state.

In an optional embodiment, the controller is used for determining the heating power F according to the following equation:

$$F=(T1-T2)*Q*a+b$$

wherein, T1 indicates the temperature of the circulating working medium in the liquid reservoir, and the unit thereof is Celsius;

T2 indicates the temperature of the circulating working medium entering the preheater, and the unit thereof is Celsius;

Q indicates a mass flow rate of the circulating working medium in the loop heat pipe, and the unit thereof is g/s;

a indicates a constant pressure specific heat of the circulating working medium, and the unit thereof is KJ/(kg Celsius); and a value of b is 1 to 3, and the unit thereof is W.

In an optional embodiment, the energy-saving loop heat pipe apparatus further includes a drive heating circuit arranged on the evaporator of the capillary pump assembly for maintaining or accelerating the flow of the working medium in the loop heat pipe.

In an optional embodiment, the drive heating circuit includes a first drive heating circuit and a second drive heating circuit, the first drive heating circuit is used for maintaining the flow of the working medium in the loop heat pipe in a standby state, and the second drive heating circuit is used for working with the first drive heating circuit to accelerate the flow of the circulating working medium after starting up, and stop working after the apparatus shifts from a power-on state to the standby state for a certain period of time.

In an optional embodiment, the first drive heating circuit has a temperature control power of 28 W to 32 W.

In an optional embodiment, the second drive heating circuit has a temperature control power of 58 W to 62 W.

In an optional embodiment, the energy-saving loop heat pipe apparatus further includes a radiator, the circulating working medium flows out of the evaporation unit assembly and then enters the capillary pump assembly through the radiator, and then enters the evaporation unit assembly through the radiator after flowing out of the capillary pump assembly.

In an optional embodiment, the radiator includes a first flow channel and a second flow channel which are adjacent to each other and independent of each other; an inlet of the first flow channel is in communication with an outlet of the evaporation unit assembly, and an outlet of the first flow channel is in communication with an inlet of the capillary pump assembly; an inlet of the second flow channel is in communication with an outlet of the capillary pump assembly; and an outlet of the second flow channel is in communication with an inlet of the evaporation unit assembly.

In an optional embodiment, the heat exchanger includes a first working medium flow channel and a second working medium flow channel which are adjacent to each other and independent of each other.

In an optional embodiment, the energy-saving loop heat pipe apparatus includes a first heat exchanger and a second heat exchanger, an inlet of the first working medium flow channel of the first heat exchanger is in communication with the outlet of the evaporation unit assembly, an outlet of the first working medium flow channel of the first heat exchanger is in communication with an inlet of the first flow channel of the radiator, an outlet of the first flow channel of the radiator is in communication with the inlet of the capillary pump assembly, the outlet of the capillary pump assembly is in communication with an inlet of the first working medium flow channel of the second heat exchanger, and an outlet of the first working medium flow channel of the second heat exchanger is in communication with an inlet of the second flow channel of the radiator, an outlet of the second flow channel of the radiator is in communication with an inlet of the second flow channel of the second heat exchanger, an outlet of the second flow channel of the second heat exchanger is in communication with an inlet of the second flow channel of the first heat exchanger, and an outlet of the second flow channel of the first heat exchanger is in communication with the inlet of the evaporation unit assembly.

In an optional embodiment, the energy-saving loop heat pipe apparatus further includes a temperature control heating circuit arranged in the liquid reservoir in the capillary pump assembly for heating the liquid reservoir to keep the temperature of the liquid reservoir constant.

The above energy-saving loop heat pipe apparatus can be applied in aerospace optical remote sensors.

Compared with the conventional technology, the present application has the following advantageous effects.

(1) By providing the heat exchanger between the evaporation unit assembly and the capillary pump assembly, the energy-saving loop heat pipe apparatus provided by the present application heats the liquid working medium that is about to enter the evaporation unit assembly with the heat of the vapor phase working medium flowing out of the evaporation unit assembly, thereby maximizing the utilization of the waste heat and saving energy;

(2) The compensation power consumption of the preheater is indirectly reduced, and the energy is further saved by preheating the circulating working medium through the heat exchanger;

(3) The preheating heating circuit provided by the present application realizes instantaneous adjustment and further reduces the thermal control power consumed by the preheater, so that a cycle average value of the power of the heating loop consumed by the preheater is reduced from 15 W to 8 W, which is reduced by 46.7%;

(4) By providing drive heating circuits having different powers and adjusting the heating powers of the drive heating circuits according to a working state of the optical remote sensor, the present application reduces a cycle average value of the powers of the drive heating circuits consumed by the evaporator from 90 W to 35 W, which is reduced by 61.1%;

(5) The present application reduces an average value of the total thermal control power consumption consumed by the loop heat pipe from 120 W to 58 W, while allowing the CCD (charge coupled device) to meet the temperature index, and the energy saving effect is very notable;

(6) Since the thermal control power consumption is finally dissipated to the space through the radiator, after the thermal control power consumption is reduced, an area of the radiator is reduced by 40%, and the weight of the radiator is thereby reduced, which contributes to the weight reduction of the camera; and (7) The overall structure of the present application is compact, is suitable for a variety of working environments, has a relatively long service life, can still operate well under complicated working conditions, has a wide application range, and has a good market application prospect.

DETAILED DESCRIPTION OF THE EMBODIMENTS

Figure 1:
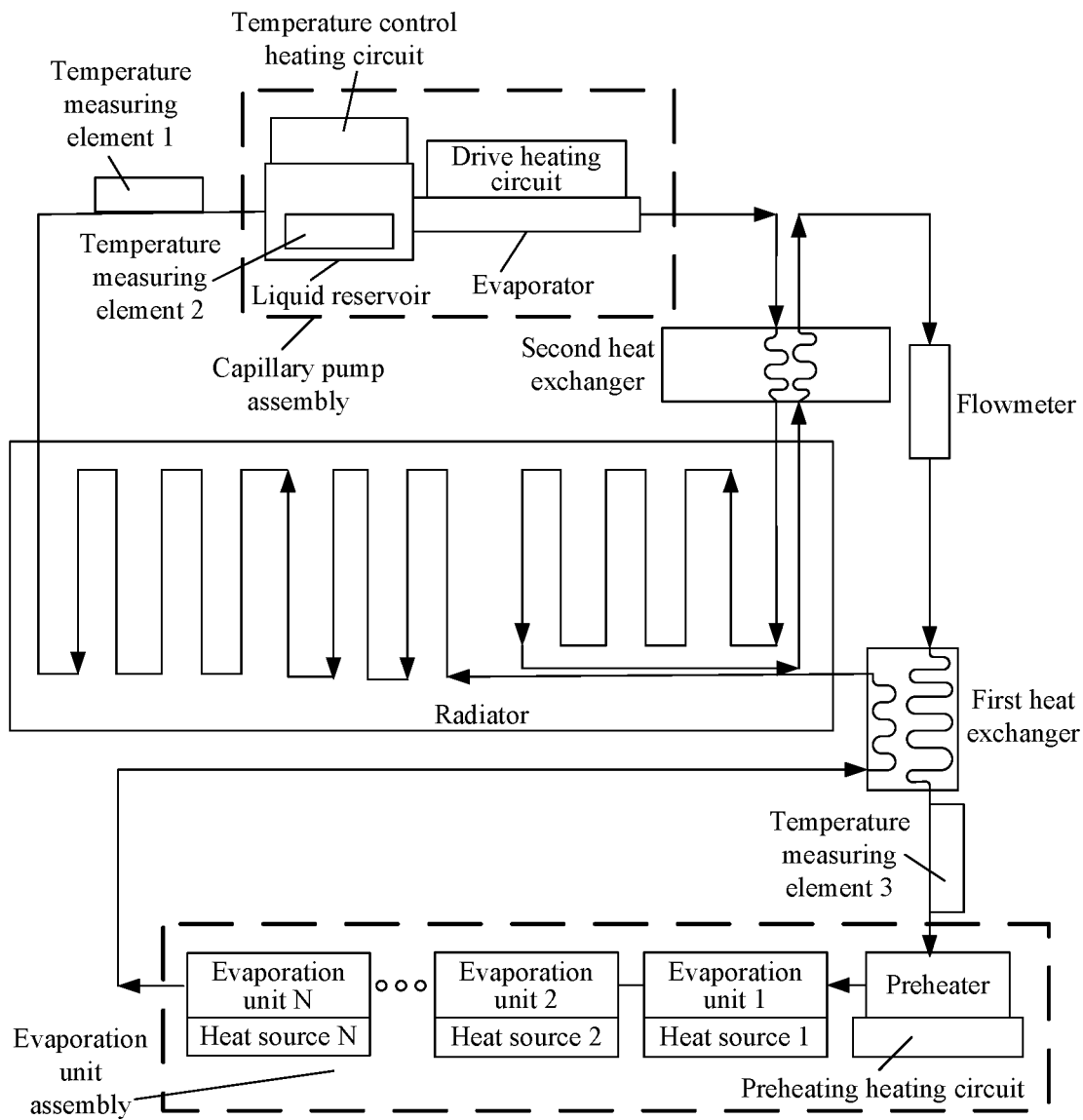
FIG. 1 is a schematic diagram of the principle of an energy-saving loop heat pipe apparatus according to an embodiment of the present application.

In order to make the solution of the present application more clear, the present application is further described below in conjunction with the drawings and specific embodiments:

Referring to FIG. 1, an energy-saving loop heat pipe apparatus is provided according to an embodiment of the present application, which includes a capillary pump assembly and an evaporation unit assembly. The capillary pump includes a liquid reservoir and an evaporator. The energy-saving loop heat pipe apparatus further includes at least one heat exchanger arranged between the capillary pump assembly and the evaporation unit assembly (such as the heat exchanger 1 and the heat exchanger 2 shown in the drawings) for heating a circulating working medium that is about to enter the evaporation unit assembly by using the heat of the circulating working medium itself in a loop heat pipe.

Specifically, the heat exchanger used in the embodiments of the present application may be a conventional heat exchanger, preferably a heat exchanger including two groups of working medium flow channels which are adjacent to each other and independent of each other. The evaporation unit assembly is used for cooling a heat source, and the number of evaporation units can be determined according to the number of the heat sources.

The circulating working medium in the loop heat pipe flows into the evaporation unit assembly and cools the heat source through further evaporation of the vapor-liquid two-phase working medium, the circulating working medium flowing out of the evaporation unit assembly enters the capillary pump assembly after passing through the heat exchanger, and the heat exchanger absorbs and stores the heat in the circulating working medium. After the circulating working medium enters the capillary pump assembly, the liquid working medium again enters the heat exchanger through the pipe after being heated and vaporized by an evaporator, and absorbs the heat stored by the heat exchanger. Thus, temperature of the working medium rises, and the working medium again enters the evaporation unit assembly.

By providing the heat exchanger between the evaporation unit assembly and the capillary pump assembly, the energy-saving loop heat pipe apparatus provided by the embodiments of the present application heats the liquid working medium that is about to enter the evaporation unit assembly with the heat of the vapor phase working medium flowing out of the evaporation unit assembly, thereby maximizing the utilization of the waste heat and saving energy.

In an optional embodiment, in order to improve the heat exchange efficiency of the evaporation unit, the evaporation unit assembly includes a preheater and at least one evaporation unit, the preheater is used for heating the circulating working medium passing by to a vapor-liquid two-phase state, and the at least one evaporation unit is used for cooling a heat source. The circulating working medium flows through the preheater after flowing through the heat exchanger, and then enters the at least one evaporation unit. The compensation power consumption of the preheater is indirectly reduced, and the energy is further saved by preheating the circulating working medium through the heat exchanger.

In an optional embodiment, the preheater includes a preheater body and a preheating heating circuit. The preheating heating circuit is arranged outside the preheater body, and is used for determining a heating power according to a temperature of the circulating working medium entering the preheater body and heating the circulating working medium passing by to the vapor-liquid two-phase state.

In an optional embodiment, the preheating heating circuit includes a controller, and a temperature measuring element, and further includes a first stage heating circuit, a second stage heating circuit and a third stage heating circuit which have different powers. The temperature measuring element is used for measuring a temperature of the circulating working medium entering the preheater body, and the controller is used for determining the heating power according to the temperature measured by the temperature measuring element and controlling the heating of the first stage heating circuit, the second stage heating circuit and/or the third stage heating circuit according to the determined heating power. By providing the three different heating circuits, the controller may select, according to the actual temperature of the circulating working medium, from the three different heating circuits for heating, which further improves the heating efficiency and reduces the energy consumption.

In a specific embodiment, the loop heat pipe apparatus is applied to a CCD device of an optical remote sensor of a spacecraft. The heating power of the first stage heating circuit is 3 W to 7 W, the heating power of the second stage heating circuit is 8 W to 12 W, and the heating power of the third stage heating circuit is 13 W to 17 W. The preheating heating circuit realizes instantaneous adjustment and further reduces the thermal control power consumed by the preheater, so that a cycle average value of the power of the heating loop consumed by the preheater is reduced from 15 W to 8 W, which is reduced by 46.7%.

In another optional embodiment, the preheating heating circuit includes a heating unit, a controller, a flowmeter and two temperature measuring elements, the flowmeter is arranged on a pipeline ahead of the preheater for measuring a flow rate of the circulating working medium in the loop heat pipe, the two temperature measuring elements are respectively used for measuring a temperature of the circulating working medium in the liquid reservoir of the capillary pump assembly and a temperature of the circulating working medium entering the preheater, and the controller is used for determining a heating power of the heating unit according to the flow rate measured by the flowmeter and the temperatures measured by the temperature measuring elements, so that the heating unit heats the circulating working medium passing by to the vapor-liquid two-phase state. The preheating loop can adjust the heating power in real time according to the state of the circulating working medium, thereby further saving the energy consumption.

In a specific embodiment, the controller is used for determining the heating power F according to the following equation:

$$F=(T1-T2)*Q*a+b$$

wherein, T1 indicates the temperature of the circulating working medium in the liquid reservoir, and the unit thereof is Celsius;

T2 indicates the temperature of the circulating working medium entering the preheater, and the unit thereof is Celsius;

Q indicates a mass flow rate of the circulating working medium in the loop heat pipe, and the unit thereof is g/s;

a indicates a constant pressure specific heat of the circulating working medium, and the unit thereof is KJ/(kg Celsius); and a value of b is 1 to 3, and the unit thereof is W.

In the present embodiment, the preheating heating circuit can automatically calculate the heating power actually required to heat the supercooled liquid circulating working medium entering the preheater to the vapor-liquid two-phase state according to the flow rate measured by the flowmeter and the temperatures measured by the temperature measuring elements, and can steplessly adjust a voltage of the preheating heating circuit in real time, so that the actual heating power output by the heating unit is consistent with the calculated result. The present embodiment can realize more precise and wider adjustment of power of the preheating heating circuit. Compared with other embodiments, the heating efficiency is further improved, and the energy consumption of the loop heat pipe is further reduced. Moreover the number of stages of the preheating heating circuit is reduced, and a scale of the preheating heating circuit is reduced.

Further, the energy-saving loop heat pipe apparatus further includes a drive heating circuit arranged on the evaporator of the capillary pump assembly for maintaining or accelerating the flow of the working medium in the loop heat pipe.

In an optional embodiment, the drive heating circuit includes a first drive heating circuit and a second drive heating circuit, the first drive heating circuit is used for maintaining the flow of the working medium in the loop heat pipe in a standby state, and the second drive heating circuit is used for working with the first drive heating circuit to accelerate the flow of the circulating working medium after starting up, and stop working after the apparatus shifts from a power-on state to the standby state for a certain period of time.

Compared with the conventional technology, the present embodiment can greatly reduce a cycle average power of the drive heating circuit, thereby reducing an area and a weight of the radiator, and saving a lot of resources for the spacecraft. Moreover, the beneficial effects become more and more notable as the total power of the heat source increases.

In a specific embodiment, the loop heat pipe apparatus is applied to a CCD device of an optical remote sensor of a spacecraft. A temperature control power of the first drive heating circuit is 28 W to 32 W, a temperature control power of the second drive heating circuit is 58 W to 62 W. By providing drive heating circuits having different powers and adjusting the heating powers of the drive heating circuits according to a working state of the optical remote sensor, the present application reduces a cycle average value of the powers of the drive heating circuits consumed by the evaporator from 90 W to 35 W, which is reduced by 61.1%.

In an optional embodiment, the loop heat pipe apparatus is applied to a CCD device of an optical remote sensor of a spacecraft. The apparatus further includes a radiator, the circulating working medium flows out of the evaporation unit assembly and then enters the capillary pump assembly through the radiator, and then enters the evaporation unit assembly through the radiator after flowing out of the capillary pump assembly. Since the thermal control power consumption is finally dissipated to the cold black aerospace through the radiator, after the thermal control power consumption is reduced, the area of the radiator is reduced by 40%, and the weight of the radiator is thereby reduced, which contributes to the weight reduction of the camera.

In an optional embodiment, the radiator includes a first flow channel and a second flow channel which are adjacent to each other and independent of each other; an inlet of the first flow channel is in communication with an outlet of the evaporation unit assembly, and an outlet of the first flow channel is in communication with an inlet of the capillary pump assembly; an inlet of the second flow channel is in communication with an outlet of the capillary pump assembly; and an outlet of the second flow channel is in communication with an inlet of the evaporation unit assembly.

As shown in FIG. 1, in an optional embodiment, the energy-saving loop heat pipe apparatus is applied to an aerospace optical remote sensor. The apparatus includes a first heat exchanger and a second heat exchanger, and the heat exchanger includes a first working medium flow channel and a second working medium flow channel which are adjacent to each other and independent of each other. An inlet of the first working medium flow channel of the first heat exchanger is in communication with the outlet of the evaporation unit assembly; an outlet of the first working medium flow channel of the first heat exchanger is in communication with the inlet of the first flow channel of the radiator; the outlet of the first flow channel of the radiator is in communication with the inlet of the capillary pump assembly, the outlet of the capillary pump assembly is in communication with an inlet of the first working medium flow channel of the second heat exchanger, an outlet of the first working medium flow channel of the second heat exchanger is in communication with the inlet of the second flow channel of the radiator, the outlet of the second flow channel of the radiator is in communication with an inlet of the second flow channel of the second heat exchanger, an outlet of the second flow channel of the second heat exchanger is in communication with an inlet of the second flow channel of the first heat exchanger, and an outlet of the second flow channel of the first heat exchanger is in communication with the inlet of the evaporation unit assembly. Such structure further improves the heat utilization rate, and an average value of the total thermal control power consumption consumed by the loop heat pipe is reduced from 120 W to 58 W. The energy saving effect is very remarkable.

In an optional embodiment, the energy-saving loop heat pipe apparatus further includes a temperature control heating loop arranged on the liquid reservoir in the capillary pump assembly for heating the liquid reservoir to keep the temperature of the liquid reservoir constant.

Figure 2:
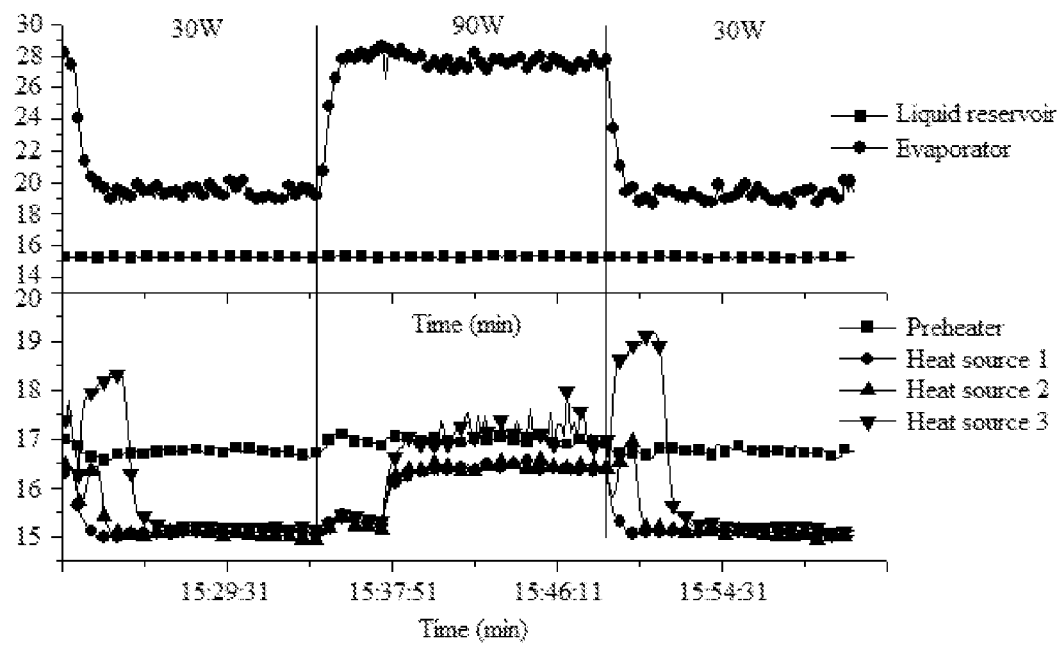
FIG. 2 is a temperature monitoring diagram of a single-cycle loop heat pipe of an energy-saving loop heat pipe apparatus according to an embodiment of the present application.
Figure 3:
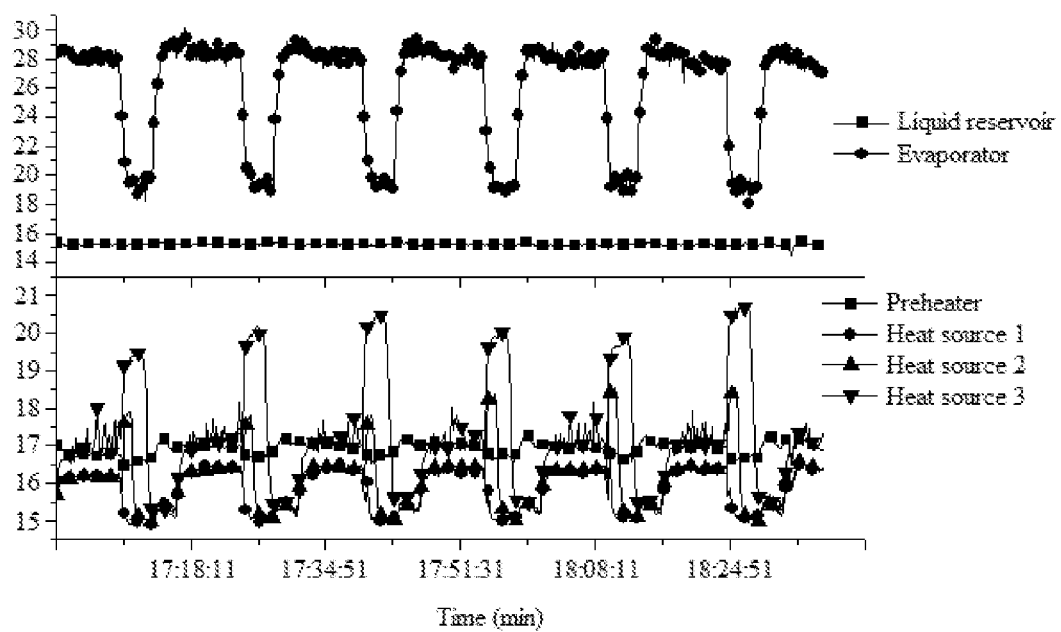
FIG. 3 is a temperature monitoring diagram of a multi-cycle loop heat pipe of an energy-saving loop heat pipe apparatus according to an embodiment of the present application.

As shown in FIGS. 2 to 3, in a specific embodiment, the energy-saving loop heat pipe apparatus provided by the present application is applied to a CCD device of a spacecraft, and a temperature stability of the CCD device reaches ±2.5 degrees Celsius, which is better than the temperature stability index of ±3 degrees Celsius. During the experiments, the temperature of the liquid reservoir is controlled at 16 degrees Celsius, the temperature of a heat sink is 2 degrees Celsius, and the radiator is cooled by water cooling. After a drive power of the evaporator is increased from 30 W to 90 W for 3 minutes, the power consumption of the CCD is increased from 0 W to 66 W, and after 8 minutes, the drive power of the evaporator is reduced from 90 W to 30 W, and each test period lasts for 15 minutes. Finally, the thermal control compensation power of the preheater can be saved to 53.3%, and the weight of the radiator is reduced to 60%.

Contents not described in detail in the specification of the present application are deemed as well known to those skilled in the art.

The invention claimed is:

1. A loop heat pipe apparatus, comprising:
a capillary pump assembly,
an evaporation unit assembly, and
a radiator arranged between the capillary pump assembly and the evaporation unit assembly and configured for heat dissipation; wherein
the capillary pump assembly comprises a liquid reservoir and an evaporator, wherein the liquid reservoir is provided with a temperature control heating circuit configured to heat the liquid reservoir;
the evaporation unit assembly comprises a preheater and at least one evaporation unit, the preheater is configured to heat a circulating working medium passing by the preheater to a vapor-liquid two-phase state, and the at least one evaporation unit is configured to cool a heat source; and
the apparatus further comprises at least one heat exchanger arranged between the capillary pump assembly and the evaporation unit assembly, and the at least one heat exchanger is configured to heat the circulating working medium that is about to enter the evaporation unit assembly by using heat of the circulating working medium itself in the loop heat pipe.

2. The loop heat pipe apparatus according to claim 1, wherein the circulating working medium flows through the preheater after flowing through the heat exchanger, and then enters the at least one evaporation unit.

3. The loop heat pipe apparatus according to claim 2, wherein the preheater comprises a preheater body and a preheating heating circuit, the preheating heating circuit is arranged outside the preheater body, and is configured to determine a heating power according to a temperature of the circulating working medium entering the preheater body and to heat the circulating working medium passing by to the vapor-liquid two-phase state.

4. The loop heat pipe apparatus according to claim 3, wherein the preheating heating circuit comprises a controller and a temperature measuring element, and further comprises a first stage heating circuit, a second stage heating circuit and a third stage heating circuit which have different powers; and the temperature measuring element is configured to measure a temperature of the circulating working medium entering the preheater body, and the controller is configured to determine the heating power according to the temperature measured by the temperature measuring element and to control heating of the first stage heating circuit, the second stage heating circuit and/or the third stage heating circuit according to the determined heating power.

5. The loop heat pipe apparatus according to claim 4, wherein the heating power of the first stage heating circuit is 3 W to 7 W.

6. The loop heat pipe apparatus according to claim 4, wherein the heating power of the second stage heating circuit is 8 W to 12 W.

7. The loop heat pipe apparatus according to claim 4, wherein the heating power of the third stage heating circuit is 13 W to 17 W.

8. The loop heat pipe apparatus according to claim 3, wherein the preheating heating circuit comprises a heating unit, a controller, a flowmeter and two temperature measuring elements, the flowmeter is arranged on a pipeline ahead of the preheater, and is configured to measure a flow rate of the circulating working medium in the loop heat pipe, the two temperature measuring elements are respectively configured to measure a temperature of the circulating working medium in a liquid reservoir of the capillary pump assembly and a temperature of the circulating working medium entering the preheater, and the controller is configured to determine a heating power of the heating unit according to the flow rate measured by the flowmeter and the temperatures measured by the temperature measuring elements, to allow the heating unit to heat the circulating working medium passing by to the vapor-liquid two-phase state.

9. The loop heat pipe apparatus according to claim 8, wherein the controller is configured to determine the heating power F according to a following equation:

$$F=(T1-T2)*Q*a+b$$

wherein T1 indicates the temperature of the circulating working medium in the liquid reservoir, and a unit of T1 is Celsius; T2 indicates the temperature of the circulating working medium entering the preheater, and a unit of T2 is Celsius; Q indicates a mass flow rate of the circulating working medium in the loop heat pipe, and a unit of Q is g/s; a indicates a constant pressure specific heat of the circulating working medium, and the unit of a is KJ/(kg Celsius); and a value of b is 1 to 3, and a unit of b is W.

10. The loop heat pipe apparatus according to claim 1, further comprising a drive heating circuit arranged on the evaporator of the capillary pump assembly and configured to maintain or accelerate flow of the working medium in the loop heat pipe.

11. The loop heat pipe apparatus according to claim 10, wherein the drive heating circuit comprises a first drive heating circuit and a second drive heating circuit, the first drive heating circuit is configured to maintain the flow of the working medium in the loop heat pipe when the apparatus is in a standby state, and the second drive heating circuit is configured to work with the first drive heating circuit to accelerate the flow of the circulating working medium after starting up and to stop working after the apparatus shifts from a power-on state to the standby state for a certain period of time.

12. The loop heat pipe apparatus according to claim 11, wherein the first drive heating circuit has a temperature control power of 28 W to 32 W.

13. The loop heat pipe apparatus according to claim 11, wherein the second drive heating circuit has a temperature control power of 58 W to 62 W.

14. The loop heat pipe apparatus according to claim 1, wherein the circulating working medium flows out of the evaporation unit assembly and then enters the capillary pump assembly through the radiator, and then enters the evaporation unit assembly through the radiator after flowing out of the capillary pump assembly.

15. The loop heat pipe apparatus according to claim 14, wherein a first flow channel and a second flow channel which are adjacent to each other and independent of each other are provided inside the radiator; the first flow channel has an inlet in communication with an outlet of the evaporation unit assembly, and an outlet in communication with an inlet of the capillary pump assembly; and the second flow channel has an inlet in communication with an outlet of the capillary pump assembly, and an outlet in communication with an inlet of the evaporation unit assembly.

16. The loop heat pipe apparatus according to claim 1, wherein a first working medium flow channel and a second working medium flow channel which are adjacent to each other and independent of each other are provided inside the heat exchanger.

17. The loop heat pipe apparatus according to claim 16, comprising a first heat exchanger and a second heat exchanger, wherein an inlet of the first working medium flow channel of the first heat exchanger is in communication with the outlet of the evaporation unit assembly, an outlet of the first working medium flow channel of the first heat exchanger is in communication with an inlet of the first flow channel of the radiator, an outlet of the first flow channel of the radiator is in communication with the inlet of the capillary pump assembly, the outlet of the capillary pump assembly is in communication with an inlet of the first working medium flow channel of the second heat exchanger, and an outlet of the first working medium flow channel of the second heat exchanger is in communication with an inlet of the second flow channel of the radiator, an outlet of the second flow channel of the radiator is in communication with an inlet of the second flow channel of the second heat exchanger, an outlet of the second flow channel of the second heat exchanger is in communication with an inlet of the second flow channel of the first heat exchanger, and an outlet of the second flow channel of the first heat exchanger is in communication with the inlet of the evaporation unit assembly.

18. The loop heat pipe apparatus according to claim 1, wherein the temperature of the liquid reservoir is kept constant.

19. An application of the loop heat pipe apparatus according to claim 1 in aerospace optical remote sensors.

* * * * *